United States Patent
Boyd et al.

(10) Patent No.: US 7,040,330 B2
(45) Date of Patent: May 9, 2006

(54) METHOD AND APPARATUS FOR MEGASONIC CLEANING OF PATTERNED SUBSTRATES

(75) Inventors: John M. Boyd, Atascadero, CA (US); Michael Ravkin, Sunnyvale, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 446 days.

(21) Appl. No.: 10/371,603

(22) Filed: Feb. 20, 2003

(65) Prior Publication Data
US 2004/0163682 A1   Aug. 26, 2004

(51) Int. Cl.
*B08B 3/00*   (2006.01)

(52) U.S. Cl. .............. 134/147; 134/137; 134/149; 134/157; 134/184; 134/185; 134/201; 134/902; 156/345.54; 156/345.55

(58) Field of Classification Search .......... 134/1, 134/184, 902, 137, 147, 149, 157, 185, 201; 156/345.54, 345.55
See application file for complete search history.

(56) References Cited

U.S. PATENT DOCUMENTS

| | | | |
|---|---|---|---|
| 5,849,091 A | * | 12/1998 | Skrovan et al. ............. 134/1 |
| 5,909,741 A | * | 6/1999 | Ferrell ....................... 134/1 |
| 6,127,281 A | * | 10/2000 | Sakaguchi et al. ......... 438/747 |
| 6,276,370 B1 | | 8/2001 | Fisch et al. |
| 6,380,099 B1 | * | 4/2002 | Sakaguchi et al. ......... 438/747 |
| 6,468,362 B1 | | 10/2002 | Chen et al. |
| 6,796,315 B1 | * | 9/2004 | Lu et al. ................... 134/1.3 |
| 2002/0139389 A1 | | 10/2002 | Treur |

FOREIGN PATENT DOCUMENTS

| | | | |
|---|---|---|---|
| FR | 2762240 | * | 10/1998 |
| JP | 8-332465 | * | 12/1996 |
| JP | 0 856 873 A2 | * | 8/1998 |
| JP | 2000-183012 | * | 6/2000 |
| JP | 2000-164887 | | 3/2001 |

* cited by examiner

Primary Examiner—M. Kornakov
(74) Attorney, Agent, or Firm—Martine Penilla & Gencarella, LLP

(57) ABSTRACT

A system for cleaning a semiconductor substrate is provided. The system includes transducers for generating acoustic energy oriented in a substantially perpendicular direction to a surface of a semiconductor substrate and an acoustic energy oriented in a substantially parallel direction to the surface of the semiconductor substrate. Each orientation of the acoustic energy may be simultaneously or alternately generated.

5 Claims, 5 Drawing Sheets

METHOD AND APPARATUS FOR MEGASONIC CLEANING OF PATTERNED SUBSTRATES

BACKGROUND OF THE INVENTION

1. Field of the Invention

The present invention relates generally to surface cleaning and, more particularly, to a method and apparatus for megasonic cleaning of a semiconductor substrate following fabrication processes.

2. Description of the Related Art

Megasonic cleaning is widely used in semiconductor manufacturing operations and can be employed in a batch cleaning process or a single wafer cleaning process. For a batch cleaning process, the vibrations of a megasonic transducer creates sonic pressure waves in the liquid of the cleaning tank which contains a batch of semiconductor substrates. A single wafer megasonic cleaning process uses a relatively small transducer above a rotating wafer, wherein the transducer is scanned across the wafer, or in the case of full immersion a single wafer tank system is used. In each case, the main particle removal mechanisms with megasonic cleaning are due to cavitation and acoustic streaming. Cavitation is the rapid forming and collapsing of microscopic bubbles generated from dissolved gas when sonic energy is applied to a liquid medium. Upon collapse, the bubbles release energy which assists in particle removal through breaking the various adhesion forces which adhere the particle to the substrate. Acoustic streaming is the fluid motion induced by the acoustic wave through the fluid when RF power is applied to a piezoelectric transducer.

FIG. 1A is a schematic diagram of a batch megasonic cleaning system. Tank 100 is filled with a cleaning solution. Wafer holder 102 includes a batch of wafers to be cleaned. Transducer 104 creates pressure waves through sonic energy with frequencies near 1 Megahertz (MHz). These pressure waves, in concert with the appropriate chemistry to control particle re-adhesion, provide the cleaning action. Because of the long cleaning time required for batch cleaning systems, as well as chemical usage, efforts have been focused on single wafer cleaning systems in order to decrease chemical usage, increase wafer-to-wafer control, and decrease defects in accordance with the International Technology Roadmap for Semiconductors (ITRS) requirements. Batch systems suffer from another disadvantage in that the delivery of megasonic energy to the multiple wafers in the tank is non-uniform and can result in 'hot spots' due to constructive interference, or 'cold spots' due to destructive interference, each being caused by reflection of the megasonic waves from both the multiple wafers and from the megasonic tank. Constructive interference can cause damage to sensitive features or pattern on the wafer substrate, and thus the average energy must be lowered to ensure any hot-spots are below the damage threshold. In cases of cold spots, insufficient cleaning occurs, and therefore, a higher megasonic energy must be applied in order to reach all regions of the wafers in wafer holder 102. In either case, a compromise must be reached to minimize damage while still providing high enough average energy to enable cleaning.

FIG. 1B is a schematic diagram of a single wafer cleaning tank. Here, tank 106 is filled with a cleaning solution. Wafer 110, supported by carrier 108, is submerged in the cleaning solution of tank 106. Transducer 104 supplies the energy to clean wafer 110. The cleaning solutions are typically designed to modify the zeta potential between the surfaces of the wafer and a particle removed from the surface of the wafer through the acoustic energy supplied by transducer 104 to prevent particle re-attachment. The cleaning solution concentration should be maintained within a fairly tight range in order to maintain a suitable zeta potential between the surfaces. However, for features such as lines, contacts, spaces, vias, etc., defined on a surface of the substrate, the particle may redeposit on the surface of the substrate due to the inability to maintain a specific cleaning solution concentration, i.e., replenish the cleaning solution, at the particle-substrate interface within the region defined by the feature. Further, in the case of a transducer oriented perpendicular to the substrate surface (as in a single-tank megasonic system), high-aspect ratio features may shadow, or shield, the lower regions of the feature from megasonic energy and cavitation. For a transducer oriented parallel to the wafer surface, cavitation can occur within the feature, but acoustic streaming is not in the most favorable direction to facilitate moving a detached particle away from the substrate.

Additionally, electrodepostion operations, in particular electroless plating, is commonly used for the deposition of a film on a substrate. For example, a copper film may be deposited on a substrate through electroless plating. One of the shortcomings of electroless plating is that the presence of any bubble formation in the features of a patterned substrate undergoing electroless plating will lead to voids in subsequent plating operations. Another shortcoming of electroless plating into high aspect ratio features is mass transport of the fresh reactants from the solution into the features, and mass transport of byproducts out of the same features.

In view of the foregoing, there is a need for a method and apparatus to provide a single wafer megasonic cleaning configuration that is capable of replenishing cleaning chemistry into regions defined by the feature in order to prevent a particle removed by the acoustic energy from re-depositing on the wafer. In addition, there is a need for controlling bubble formation in the vicinity of features undergoing electroless plating operations and improving mass transport of reactants and by-products into and out of high aspect ratio features.

SUMMARY OF THE INVENTION

Broadly speaking, the present invention fills these needs by providing a method and apparatus for supplying acoustic energy into the feature for dislodging a particle and for replenishing the cleaning chemistry into the feature region to assist in the removal of detached particles. In addition, the invention provides a system and method for controlling bubble formation and improving mass transport during electroless plating operations. It should be appreciated that the present invention can be implemented in numerous ways, including as a method, a system, or an apparatus. Several inventive embodiments of the present invention are described below.

In one embodiment, a method for cleaning a semiconductor substrate is provided. The method initiates with generating acoustic energy oriented in a substantially perpendicular direction to a surface of a semiconductor substrate. Then, acoustic energy oriented in a substantially parallel direction to the surface of the semiconductor substrate is generated. Each orientation of the acoustic energy may be simultaneously generated (in phase) or alternately generated (out of phase).

In another embodiment, an apparatus for cleaning a semiconductor substrate is provided. The apparatus includes a base and at least one sidewall extending from the base. The sidewall is substantially perpendicular to the base. A first megasonic transducer affixed to the base is included. A second megasonic transducer affixed to the sidewall is also included. The first megasonic transducer is oriented in a substantially orthogonal manner to the second megasonic transducer.

In yet another embodiment, a system for cleaning a semiconductor substrate is provided. The system includes a tank having an inner cavity defined by a base and at least one sidewall extending therefrom. The tank is configured to retain a volume of a liquid within the inner cavity. A substrate support configured to support and rotate a semiconductor substrate about an axis of the semiconductor substrate is included. The substrate support is further configured to support and rotate the semiconductor substrate in the inner cavity of the tank. A first megasonic transducer coupled to the base is included. A top surface of the megasonic transducer is substantially parallel to a bottom surface of the semiconductor substrate. A second megasonic transducer is coupled to the at least one sidewall. The first megasonic transducer is configured to generate acoustic energy associated with a direction substantially perpendicular to the bottom surface of the semiconductor substrate. The second megasonic transducer is configured to generate acoustic energy associated with a direction substantially parallel to the bottom surface of the semiconductor substrate.

In still yet another embodiment, a method for electroless plating of a substrate is provided. The method initiates with immersing a substrate into a plating solution. Then, a film is deposited onto a surface of the substrate. Also, acoustic energy is transferred to the plating solution. The acoustic energy is directed at the surface of the substrate to control bubble formation at the surface of the substrate using a transducer oriented substantially parallel to the wafer surface in one embodiment In another embodiment, the acoustic energy is directed at the surface of the substrate to improve mass transfer of the reactants and by-products at the surface of the substrate using a transducer oriented substantially perpendicular to the wafer surface.

In another embodiment, an apparatus for electroless plating of a substrate is provided. The apparatus includes a tank configured to retain a plating solution and a transducer configured to transfer acoustic energy to the plating solution.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1A:
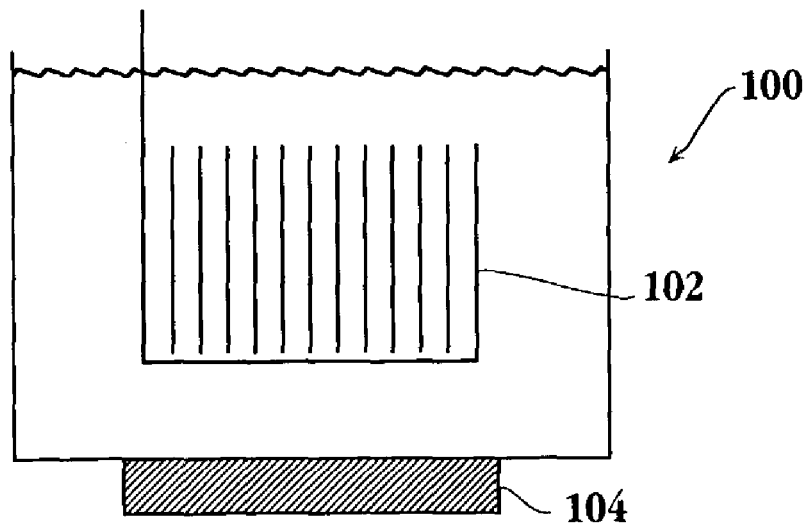
FIG. 1A is a schematic diagram of a batch megasonic cleaning system.
Figure 1B:
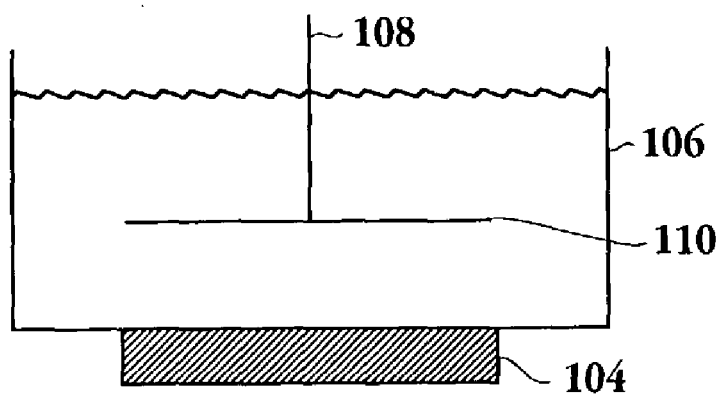
FIG. 1B is a schematic diagram of a single wafer cleaning tank.

An invention is described for a system, apparatus and method that provides a megasonic cleaning scheme optimized for providing acoustic energy directly into a defined feature of a patterned substrate and for replenishing the region defined by the feature with cleaning chemistry. It will be obvious, however, to one skilled in the art, that the present invention may be practiced without some or all of these specific details. In other instances, well known process operations have not been described in detail in order not to unnecessarily obscure the present invention. FIGS. 1A and 1B are described in the "Background of the Invention" section. The term about as used to herein refers to +/−10% of the referenced value.

The embodiments of the present invention provide a system and method for optimizing the cleaning efficiency of megasonic cleaning of patterned substrates. As used herein, substrate and wafer are interchangeable. By supplying two megasonic transducers oriented orthogonally, where one transducer is substantially parallel to a surface of a substrate being cleaned and the other transducer is substantially perpendicular to the surface of a substrate being cleaned, both cavitation effects and acoustic streaming effects are optimized. That is, the megasonic transducer that is substantially parallel to the surface of the substrate is able to supply acoustic energy directly into the features of a patterned substrate. The acoustic energy supplied directly into the features induces cavitation to dislodge any particles within the features. On the other hand, the megasonic transducer that is oriented in a substantially perpendicular manner relative to the surface of a substrate being cleaned, is able to provide acoustic streaming parallel to the wafer surface. The acoustic streaming induces eddies or turbulence in the region around the feature and inside of the feature. Consequently, chemical transport into and out of the feature is enhanced to enable chemical cleaning within the feature.

Additionally, the embodiments described herein provide a system and method for improving the deposition quality of an electroless plating operation through the application of megasonic energy. The application of megasonic energy induces cavitation which assists in the collapses of bubbles formed during the plating process. The size to which the bubbles grow before collapse depends on the frequency of the megasonic energy applied. Therefore, the formation of bubbles at the surface undergoing the plating operation may be controlled through the application of megasonic energy with the plating operation.

Figure 2:
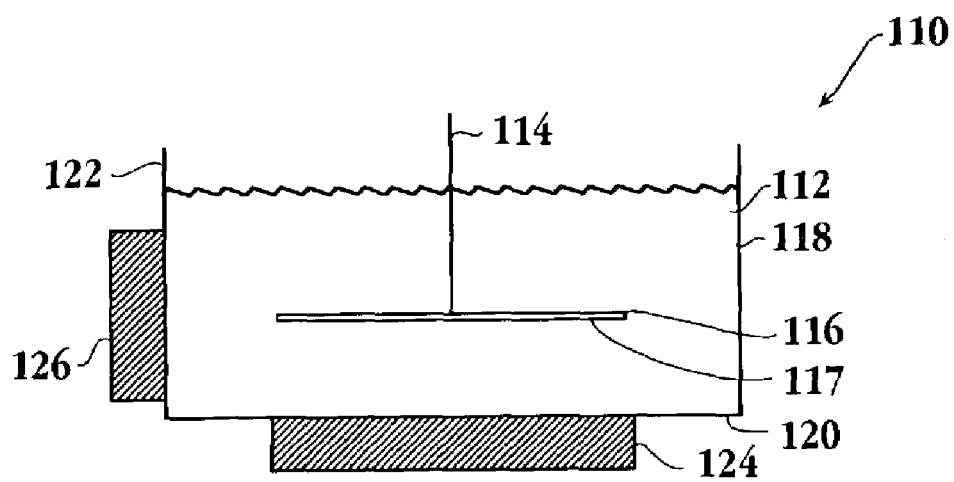
FIG. 2 is a simplified megasonic cleaning apparatus in accordance with one embodiment of the invention.

FIG. 2 is a simplified megasonic cleaning apparatus in accordance with one embodiment of the invention. Megasonic cleaning apparatus 110 includes a tank having side walls 118 and 122, both of which extend from base 120. The tank contains cleaning solution 112. Cleaning solution 112 may be any suitable cleaning solution used for megasonic cleaning and has properties which facilitate removable particles as well as inhibit re-deposition of particles on a surface of substrate 116. As used herein, cleaning solution and cleaning chemistry are interchangeable. As can be seen, substrate 116 is immersed in cleaning solution 112 and is supported by carrier 114. It will be apparent to one skilled in the art that any suitable means for supporting substrate 116 in cleaning solution 112 of the megasonic cleaning tank may be used here. The megasonic cleaning tank is coupled to megasonic transducers 124 and 126. Megasonic transducer 126 is oriented perpendicular to the bottom surface 117 of substrate 116. Thus, transducer 126 provides acoustic streaming parallel to the bottom surface 117 as will be shown below. Megasonic transducer 124 is oriented parallel to bottom surface 117 of substrate 116. Therefore, transducer 124 provides acoustic energy which is able to access features, i.e., vias, holes, trenches, etc., to induce cavitation within those features. That is, the horizontal and vertical transducers relative to the wafer surface orientation provides acoustic streaming and mass transport assist particle removal and chemical fluid exchange to the wafer surface and cavitation to dislodge and remove particles bonded to the substrate surface.

Figure 3:
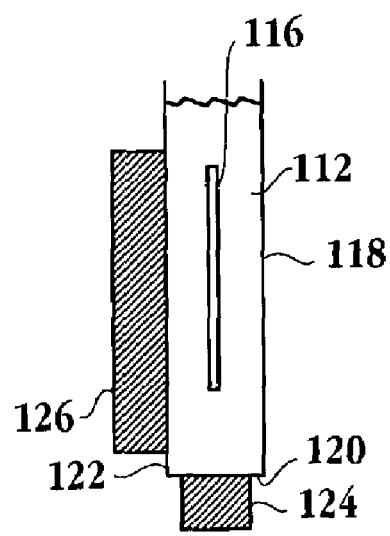
FIG. 3 is an alternative embodiment to the megasonic cleaning apparatus illustrated in FIG. 2.

FIG. 3 is an alternative embodiment to the megasonic cleaning apparatus illustrated in FIG. 2. Here, substrate 116 is oriented in a vertical position rather than the horizontal position of FIG. 2. It will be apparent to one skilled in the art that substrate 116 may be supported by any suitable substrate support means, e.g., a substrate carrier, rollers, etc. Substrate 116 is immersed in cleaning solution in 112 which is contained in a cavity defined by base 120 and sidewalls 118 and 122 of the megasonic cleaning tank. It should be appreciated that the shape of megasonic cleaning tank may be any shape suitable to provide the transfer of acoustic energy from transducers in a manner where one transducer provides acoustic energy in a substantially perpendicular direction to the surface of the substrate and the other transducer provides acoustic energy in a substantially parallel direction to the surface of the substrate. In one embodiment, the perpendicular direction of the acoustic energy is between about 5 degrees of normal, i.e. 90±5 degrees. In another embodiment, the parallel direction of the acoustic energy is between about 5 degrees of parallel, i.e. 0±5 degrees. Thus, the shape of the base may be rectangular, square, or even circular, where the side walls are configured, to allow for the placement of a megasonic transducer which transfers acoustic energy in an orthogonal orientation as compared to the acoustic energy transmitted by the base megasonic transducer. It should be appreciated that cleaning solution 112 may be any commercially available cleaning solution such as cleaning solutions available from DUPONT Electronic Technologies, EKC Technology, Inc., or ASHLAND Corporation.

Figure 4:
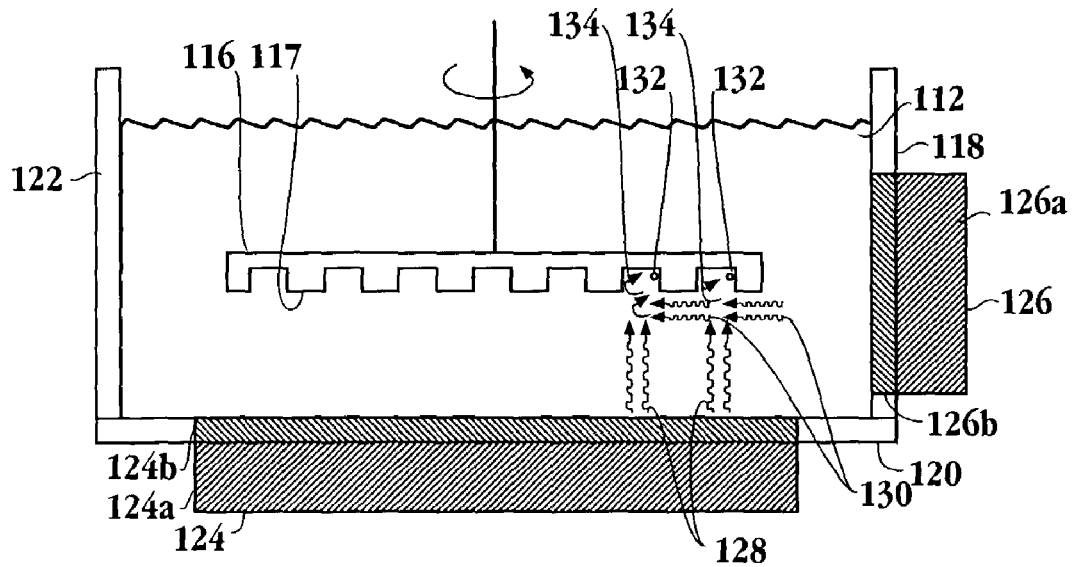
FIG. 4 is an enlarged cross-sectional view of a megasonic cleaning apparatus in accordance with one embodiment of the invention.

FIG. 4 is an enlarged cross-sectional view of a megasonic cleaning apparatus in accordance with one embodiment of the invention. Here, patterned surface 117 of substrate 116 is shown in more detail, i.e., the features of the patterned surface are illustrated. Substrate 116 is immersed in cleaning solution 112 which is contained within a cavity defined between sidewall 118, sidewall 122 and base 120 of the megasonic cleaning tank. It should be appreciated that substrate 116 may be rotated about its axis through a suitable substrate support. Megasonic transducers 124 and 126 include transducer element 124a and 126a, respectively, and resonator element 124b and 126b, respectively. Megasonic transducers 124 and 126 may be any suitable megasonic transducer commercially available. Megasonic transducers typically generate energy in the frequency range of 500 Kilohertz (KHz) to 5 Megahertz (MHz). It will be apparent to one skilled in the art that the particular materials chosen for the megasonic transducer will determine the frequency range generated. Suitable materials include piezo electric materials and piezo ceramic materials, e.g., quartz, and sapphire.

The orientation of megasonic transducer 124 relative to megasonic transducer 126 allows for optimal energy and mass transport benefits for improved cleaning of patterned substrate 116. Megasonic transducer 124 provides acoustic energy that is capable of accessing the features of surface 117 of substrate 116. Here, the acoustic energy will induce cavitation in order to dislodge particle 132 which is adhered to an inner surface of the feature of surface 117. In order to prevent re-attachment of particle 132 to the inner surface, megasonic transducer 126 provides acoustic energy which causes acoustic streaming as illustrated by arrows 130. Acoustic streaming is the fluid motion induced by the velocity gradient in the fluid when subjected to acoustic energy. Acoustic streaming is a function of frequency and delivered intensity and provides a strong localized flow of cleaning solution whose sheer force is the primary particle removal agent. The flow caused by the acoustic streaming, as illustrated by arrows 130, causes eddies 134 within the features defined on surface 117. Eddies 134, also referred to as turbulence, improves mass transport into and out of the features, allowing fresh cleaning solution to be introduced into the features defined on surface 117 and also sweeps away any removed particles dislodged from the features through cavitation caused by the acoustic energy delivered into the features from megasonic transducer 124.

Arrows 128 of FIG. 4, represent the acoustic energy delivered inside the features of bottom surface 117 from megasonic transducer 124. As mentioned above, acoustic energy 128 induces cavitation to dislodge particle 132. It should be appreciated that turbulence or eddies 134 helps to improve reactant/byproduct transfer into and out of the features, especially high aspect ratio features. However, direct energy is delivered into the feature in order to provide cavitation and particle removal. Thus, the orientation of megasonic transducers parallel and perpendicular to a surface of the wafer provides both the direct energy for cleaning features defined on the surface of the substrate and for the chemical transfer into the features.

Figure 5:
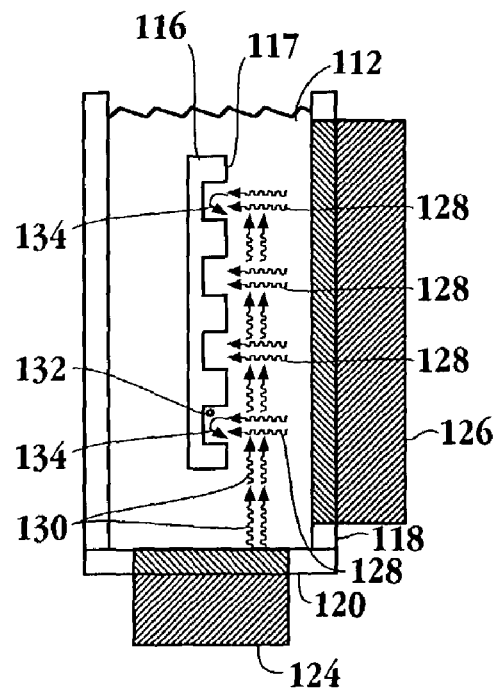
FIG. 5 is an alternative embodiment of the megasonic cleaning tank of FIG. 4.

FIG. 5 is an alternative embodiment of the megasonic cleaning tank of FIG. 4. Here, substrate 116 is oriented in a vertical position rather than a horizontal position. Accordingly, megasonic transducer 126 provides the direct energy, illustrated by arrows 128, for dislodging particle 132 from features defined on surface 117 of substrate 116. Megasonic transducer 124 provides the acoustic streaming illustrated by arrows 130 which causes eddies 134 in order to sweep away particle 132 and introduce fresh cleaning solution into the features of bottom surface 117. As cleaning solution 112 is specifically designed for a single wafer cleaning operation, it should be appreciated that as the reactant/byproduct concentration of cleaning solution 112 is changed, the cleaning characteristics will likewise change. That is, cleaning solution 112 inside high aspect ratio features, e.g., the features on surface 117 of substrate 116, cleans the inside of the high aspect ratio feature. As the cleaning occurs, the concentration of the cleaning solution in that feature may change, thus changing the interface properties and zeta potential between the particle and substrate surface. This change may allow particle 132 to re-adhere to a surface of substrate 116 since the cleaning solution may not maintain a suitable or consistent zeta potential between the surfaces of particle 132 and surface 117. Thus, the acoustic streaming, or more accurately, eddies 134 caused by the acoustic streaming, prevents this from happening by improving mass transport and replenishing the cleaning solution in the feature.

Figure 6:
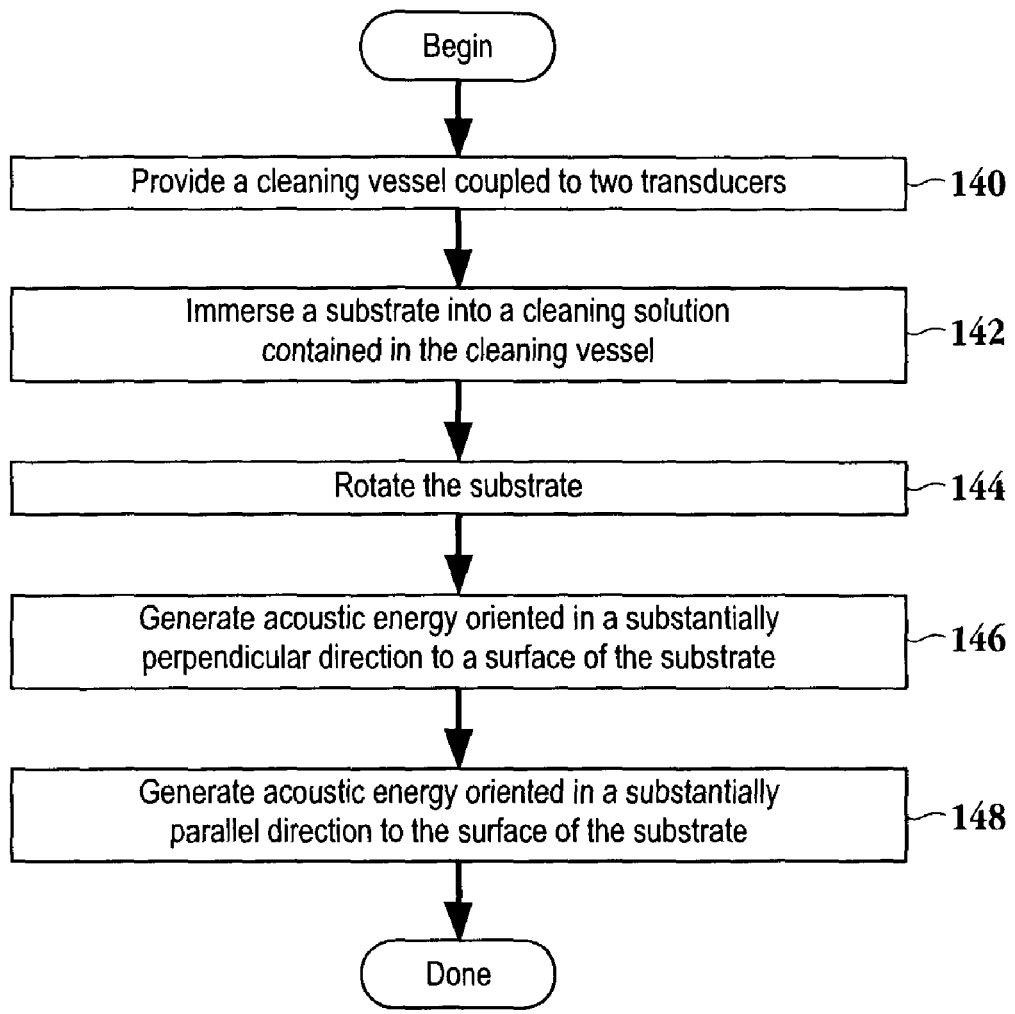
FIG. 6 is a flow chart diagram illustrating the method operations for cleaning a semiconductor substrate through megasonic cleaning in accordance with one embodiment of the invention.

FIG. 6 is a flow chart diagram illustrating the method operations for cleaning a semiconductor substrate through megasonic cleaning in accordance with one embodiment of the invention. The method initiates with operation 140 where a cleaning vessel, coupled to two separate transducers, is provided. For example, the cleaning vessel illustrated with reference to FIGS. 2 through 5 may be provided here. The method then advances to operation 142 where a substrate is immersed into a cleaning solution contained in the cleaning vessel. It should be appreciated that the immersed substrate is oriented such that one megasonic transducer is substantially parallel to a surface to be cleaned on the substrate and the second megasonic transducer is substantially perpendicular to the surface of the substrate to be cleaned. In other words, the transducers are oriented in such a way that the respective acoustic energies transferred to the cleaning solution from each transducer are approximately orthogonal to each other, i.e., oriented at about a right angle to each other. As mentioned above, the cleaning solution may be commercially available cleaning solution specifically designed for single-wafer cleaning and also may even be de-ionized water. The method then proceeds to operation 144 where the substrate is rotated. Here, the substrate may be rotated through any suitable means known in the art.

The method of FIG. 6 then moves to operation 146 where acoustic energy is generated in a substantially perpendicular direction to a surface of the substrate. Here, the acoustic energy directly impinges high aspect ratio features in order to provide cavitation for particle removal during cleaning of the high aspect ratio features. The method then advances to operation 148 where the acoustic energy is generated in a substantially parallel direction to the surface of the substrate. Here, the acoustic energy causes eddies which help improve reactant/byproduct transfer into an out-of-the-high aspect ratio features. In other words, the acoustic streaming helps replenish chemistry in order to prevent particles from re-depositing on a surface of the wafer being cleaned. Additionally, the acoustic streaming enhances the transport of particles one they are detached. It should be appreciated that the acoustic energy generated in a substantially perpendicular direction and the acoustic energy generated in the substantially parallel direction may be simultaneously applied or they may be alternately applied or some combination thereof. More specifically, the transducers may be powered at the same time or alternately, i.e., the transducers may be in phase or out of phase.

Figure 7A:
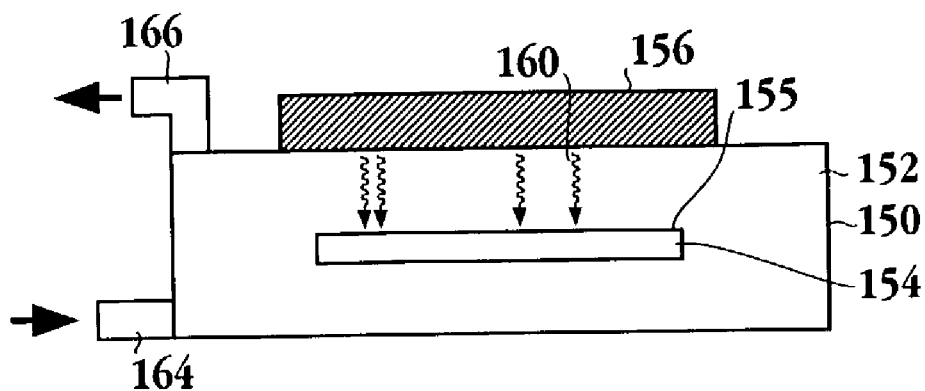
FIG. 7A is a simplified schematic diagram of a megasonic transducer being used in an electroless plating operation in accordance with one embodiment of the invention.

FIG. 7A is a simplified schematic diagram of a megasonic transducer being used in an electroless plating operation in accordance with one embodiment of the invention. Here, electroless plating vessel 150 contains plating solution 152. Substrate 154 is supported inside electroless plating vessel 150. As is generally known electroless plating occurs by the immersion of components in a plating solution. The plating solution generally consists of a soluble metal salt and a reducing agent. The metal salts are reduced onto an oxide-free surface. Thus, a metal film may be deposited on a surface, e.g., copper, nickel, etc. However, any bubble formation on or near the surface in which the metal is deposited, may cause voids in the resulting metal film. Thus, by coupling megasonic transducer 156 to electroless plating vessel 150, acoustic energy 160 is capable of being directed to the surface of substrate 154, through plating solution 152 which is in contact with the megasonic transducer and the substrate, in order to collapse any bubbles that might be present. Accordingly, a more reliable and uniform film may be deposited on surface 155 of substrate 154.

Figure 7B:
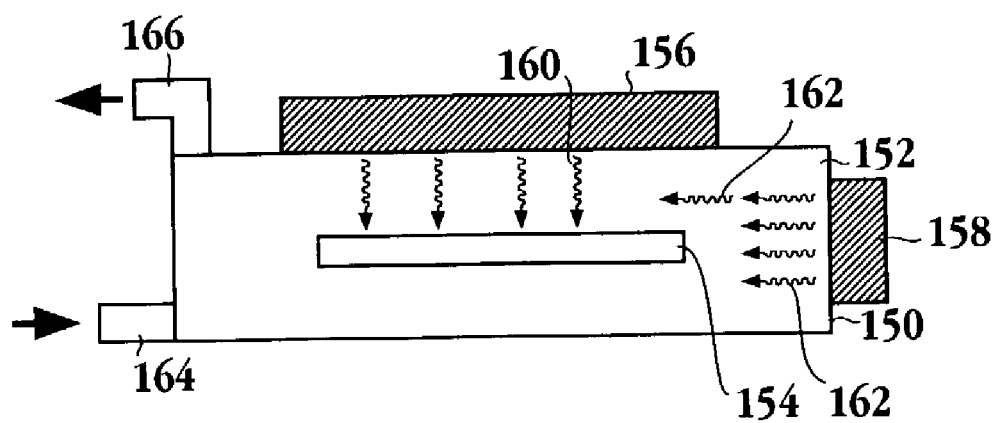
FIG. 7B is an alternate embodiment of the electroless plating vessel of FIG. 7A.

FIG. 7B is an alternate embodiment of the electroless plating vessel of FIG. 7A. Here, a second megasonic transducer is introduced substantially perpendicular to substrate 154. Thus, transducer 158 allows for acoustic streaming to be used to clear away any particles from the surface of substrate 154 during the electroless plating process. That is, the acoustic streaming from transducer 158 improves mass transfer of the reactants and by-products at the surface of substrate 154. It should be appreciated that electroless plating vessel 150 may include the capability to re-circulate or replenish plating solution 152. Here inlet 164 may provide fresh plating solution to plating vessel 150, while outlet 166 is used for the removal of displaced plating solution. It will be apparent to one skilled in the art that the plating solution may be re-circulated through inlet 164 and outlet 166 as an alternative to a once pass system. In one embodiment, plating solution 152 is overflow dumped to waste collection or drain. Furthermore, the position of inlet 164 and outlet 166, as well as the shape of the plating vessel may be any suitable position or shape, respectively, in order to perform the electroless plating operation.

In summary, the above described invention describes a method and a system for optimizing the cleaning efficiency for patterned substrates. By orienting two megasonic transducers, one in a horizontal orientation and another in a vertical orientation, relative to a surface of the substrate to be cleaned, the cavitation and the acoustic streaming properties associated with the megasonic energy are optimized. The horizontally oriented megasonic transducer, i.e., oriented substantially parallel to the substrate surface, has a line of sight into the feature so that acoustic energy may be delivered into the feature to provide cavitation. The cavitation will dislodge any particles inside the feature.

The vertically oriented megasonic transducer, i.e., oriented substantially perpendicular to the substrate surface, delivers acoustic streaming parallel to the surface of the wafer. The acoustic streaming causes eddies and turbulence for removing the dislodged particle and also replenishes the cleaning chemistry within the feature, e.g., a high aspect ratio feature, to further assure that the dislodged particle does not re-attach to a surface within the feature. In essence, the acoustic streaming allows for chemical cleaning within the feature by replenishing the cleaning chemistry within the feature. It should be appreciated that the embodiments described herein may also be applied to applications where it is desirable to enhance a chemical reaction. For example with respect to resist stripping the embodiments described herein will assist the mass transport of reactants to remove reacted material. That is, the acoustic streaming described above will enhance mass transfer.

Additionally, the embodiments described herein allow for a higher quality film deposition with respect to electroless plating operations. Through the application of megasonic energy during electroless plating operations, bubble formation may be controlled at the surface of the object undergoing the electroless plating operation. Through the cavitation properties associated with megasonic energy transferred to the plating solution, bubbles are effectively removed from the vicinity around the surface of the object, thereby allowing for the substantial elimination of voids within the deposited film.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A system for cleaning a single semiconductor substrate, comprising:
   a tank having an inner cavity defined by a base and at least one sidewall extending therefrom, the tank configured to retain a volume of a liquid within the inner cavity to immerse the single semiconductor substrate;
   a substrate support configured to support and rotate the single semiconductor substrate about an axis of the semiconductor substrate, the substrate support further configured to support and rotate the single semiconductor substrate in the inner cavity of the tank wherein the substrate support orients a surface of the semiconductor substrate to be substantially parallel to the base
   a first megasonic transducer coupled to the base with a top surface of the megasonic transducer, wherein the top surface of the megasonic transducer being substantially parallel to a bottom surface of the single semiconductor substrate; and
   a second megasonic transducer coupled to the at least one sidewall, wherein the first megasonic transducer is configured to generate acoustic energy associated with a direction substantially perpendicular to the bottom surface of the single semiconductor substrate and the second megasonic transducer is configured to generate acoustic energy associated with a direction substantially parallel to the bottom surface of the single semiconductor substrate.

2. The system of claim 1, wherein the acoustic energy has a frequency between about 500 KHz and about 5 MHz, and the acoustic energy is associated with the direction substantially perpendicular to the bottom surface of the single semiconductor substrate provides cavitation energy for dislodging particles deposited within features defined on the bottom surface of the single semiconductor substrate.

3. The system of claim 1, wherein the acoustic energy has a frequency between about 500 KHz and about 5 MHz, and the acoustic energy is associated with the direction substantially parallel to the bottom surface of the single semiconductor substrate provides acoustic streaming energy for replenishing a concentration of the liquid within features defined on the bottom surface of the single semiconductor substrate.

4. The system of claim 1, wherein the first megasonic transducer and the second megasonic transducer are configured to operate in phase.

5. The system of claim 1, wherein the first megasonic transducer and the second megasonic transducer are configured to operate out of phase.

* * * * *